(12) United States Patent
Babitch et al.

(10) Patent No.: US 10,914,643 B2
(45) Date of Patent: Feb. 9, 2021

(54) SYSTEM AND METHOD FOR MODELING AND CORRECTING FREQUENCY OF QUARTZ CRYSTAL OSCILLATOR

(71) Applicant: Samsung Electronics Co., Ltd., Gyeonggi-do (KR)

(72) Inventors: Daniel Babitch, San Jose, CA (US); Kuangmin Li, San Jose, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/884,620

(22) Filed: May 27, 2020

(65) Prior Publication Data
US 2020/0292395 A1    Sep. 17, 2020

Related U.S. Application Data

(63) Continuation of application No. 16/161,985, filed on Oct. 16, 2018.

(60) Provisional application No. 62/663,110, filed on Apr. 26, 2018.

(51) Int. Cl.
G01K 7/32      (2006.01)
H03L 1/02      (2006.01)
H03L 1/04      (2006.01)
G01S 19/01     (2010.01)

(52) U.S. Cl.
CPC .............. G01K 7/32 (2013.01); G01S 19/01 (2013.01); H03L 1/022 (2013.01); H03L 1/04 (2013.01)

(58) Field of Classification Search
CPC .......... G01K 7/32; G01K 13/00; H03L 1/022; H03L 1/044; G01S 19/01
See application file for complete search history.

(56) References Cited

U.S. PATENT DOCUMENTS

| 5,986,515 | A | 11/1999 | Sakurai | |
| 6,584,380 | B1 | 6/2003 | Nemoto | |
| 6,636,121 | B2 * | 10/2003 | Barak | H03L 1/026 331/158 |
| 7,548,130 | B2 | 6/2009 | Kobayashi | |
| 8,742,863 | B1 | 6/2014 | Zaslaysky | |
| 2008/0164952 | A1 * | 7/2008 | Babitch | G01S 19/235 331/66 |
| 2009/0108949 | A1 | 4/2009 | Yan et al. | |

(Continued)

FOREIGN PATENT DOCUMENTS

JP    1996-116214    5/1996
JP    2003-234618    8/2003

Primary Examiner — Jeffrey M Shin
(74) Attorney, Agent, or Firm — The Farrell Law Firm, P.C.

(57) ABSTRACT

A method and system for generating a crystal model for a test product including a crystal oscillator are herein disclosed. The method includes measuring a first temperature of the test product and measuring a first frequency error of the crystal oscillator at a first calibration point during a product testing process, measuring a second temperature of the test product and measuring a second frequency error of the crystal oscillator at a second calibration point during the product testing process, estimating two parameters from the first temperature, first frequency error, second temperature, and second frequency error, and determining a $3^{rd}$ order polynomial for the crystal model based on the two parameters.

20 Claims, 7 Drawing Sheets

(56) References Cited

U.S. PATENT DOCUMENTS

| | | |
|---|---|---|
| 2009/0195322 A1 | 8/2009 | Yan et al. |
| 2011/0187422 A1 | 8/2011 | Hammes |
| 2013/0321048 A1 | 12/2013 | He |
| 2014/0184344 A1 | 7/2014 | Zhang |
| 2018/0342980 A1 | 11/2018 | Esterline |

\* cited by examiner

SYSTEM AND METHOD FOR MODELING AND CORRECTING FREQUENCY OF QUARTZ CRYSTAL OSCILLATOR

PRIORITY

This application is a Continuation Application of U.S. application Ser. No. 16/161,985, filed on Oct. 16, 2018, which claims priority under 35 U.S.C. § 119(e) to a U.S. Provisional Patent Application filed on Apr. 26, 2018 in the United States Patent and Trademark Office and assigned Ser. No. 62/663,110, the entire contents of which are incorporated herein by reference.

FIELD

The present disclosure relates generally to a method and system for calibration of a quartz crystal oscillator.

BACKGROUND

A communication system typically requires a crystal oscillator with accurate and stable frequency better than uncorrected quartz crystals. A crystal oscillator is an electronic oscillator circuit that uses mechanical resonance of a vibrating crystal of piezoelectric material to create an electrical signal with a certain frequency. A most common type of piezoelectric resonator used is the quartz crystal, so an oscillator circuit incorporating a quartz crystal may be referred to as a crystal oscillator.

Environmental changes of temperature, humidity, pressure, and vibration may change the resonant frequency of a quartz crystal. To overcome such environmental changes to reduce/improve frequency variations of a crystal oscillator, typical solutions such as a temperature compensated crystal oscillator (TCXO), and a digitally compensated crystal oscillator (DCXO) are utilized. A TCXO uses analog frequency correction directed by analog voltage generated by a temperature sensor to adjust a voltage variable capacitor. A DCXO uses a digitally controlled capacitor bank to direct frequency corrections.

Due to limitations of quartz crystal manufacturing tolerance, the compensation needed is different for each individual crystal. Typically, each TCXO is adjusted by running the device over temperature in the crystal oscillator production factory. Such a process is relatively slow and expensive, roughly doubling the cost of a TCXO above an uncompensated crystal oscillator. A TCXO may also use relatively more physical area.

SUMMARY

According to one embodiment, a method of generating a crystal model for a test product including a crystal oscillator is provided. The method includes measuring a first temperature of the test product and measuring a first frequency error of the crystal oscillator at a first calibration point during a product testing process, measuring a second temperature of the test product and measuring a second frequency error of the crystal oscillator at a second calibration point during the product testing process, estimating two parameters from the first temperature, first frequency error, second temperature, and second frequency error, and determining a $3^{rd}$ order polynomial for the crystal model based on the two parameters.

According to one embodiment, a system for generating a crystal model for a test product including a crystal oscillator is provided. The system includes a temperature sensor configured to measure a first temperature of the test product at a first calibration point during a product testing process and measure a second temperature of the test product at a second calibration point during the product testing process, a frequency error measurer configured to measure a first frequency error of the crystal oscillator at the first calibration point during the product testing process and measure a second frequency error of the crystal oscillator at the second calibration point during the product testing process, and a processor configured to estimate two parameters from the first temperature, first frequency error, second temperature, and second frequency error, and determine a $3^{rd}$ order polynomial for the crystal model based on the two parameters.

According to one embodiment, a method for testing an electronic product including a crystal oscillator is provided. The method includes measuring a first temperature of the electronic product and measuring a first frequency error of the crystal oscillator at a first calibration point, measuring a second temperature of the electronic product and measuring a second frequency error of the crystal oscillator at a second calibration point, and generating a crystal model for the crystal oscillator by estimating two parameters from the first temperature, first frequency error, second temperature, and second frequency error, and determining a 3rd order polynomial for the crystal model based on the two parameters.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
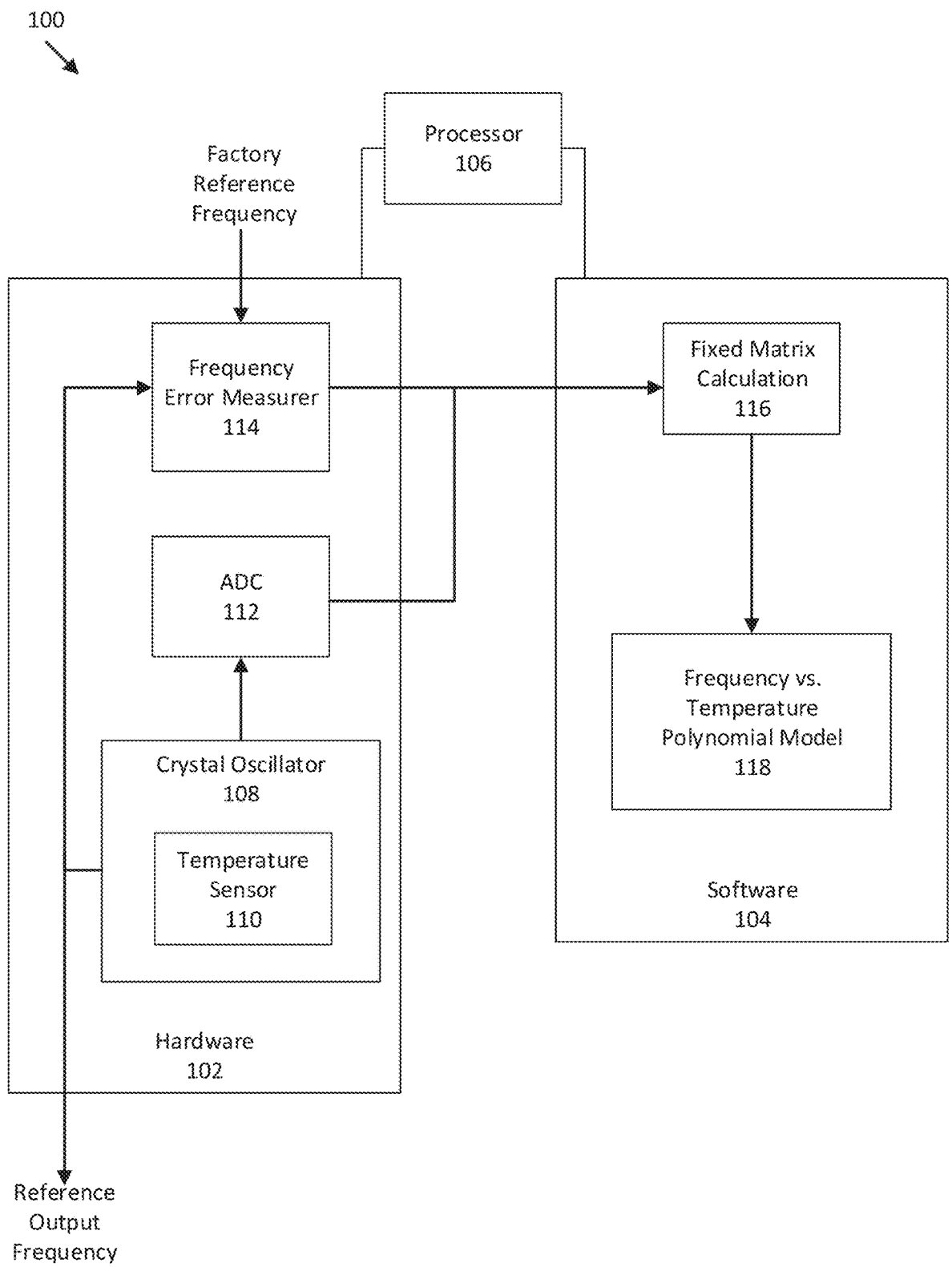
FIG. 1 is a diagram of a factory calibration system, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

To overcome environmental changes to reduce/improve frequency variations of a crystal oscillator, a temperature compensated crystal oscillator (TCXO), and a digitally compensated crystal oscillator (DCXO) may be utilized.

The present systems and methods provide crystal oscillators with reduced cost and improved performance. The present systems and methods use minimal factory calibrations for reduced cost and a new crystal model that allows errors after factory calibration to be significantly less than typical models.

The present systems and methods provide an improved technique for using crystals that have not been temperature tested. The characteristics of the crystals are learned in the factory where crystal devices are assembled into products. The products may contain computational capability, and self-correcting (learning) of the crystals is possible after sale in the user's field applications. The present systems and methods also provide modeling to improve temperature variations several times better compared to other typical methods after factory calibration. It is appreciated that the present systems and methods may be applied to any type of temperature dependent oscillator or resonator without deviating from the scope of the present disclosure.

The present systems and methods may also have applications to manufacturing of a TCXO. The modeling may reduce the cost of typical analog TCXO manufacturing by reducing the required test temperature range. This reduces manufacturing time of a TCXO and therefore the cost.

FIG. 1 is a diagram of a factory calibration system 100, according to an embodiment. The system 100 may be implemented utilizing hardware 102 and software 104, the operations of which may be controlled by a processor 106. The system 100 includes a crystal oscillator 108 (e.g., a TCXO, a DCXO, etc.) and a temperature sensor 110, which may be co-located with the oscillator 108. The system 100 includes an analog to digital converter (ADC) 112 that may be used to measure temperature and a frequency error measurer 114 (e.g., a global navigation satellite system (GNSS)).

When the system 100 is in operation, the crystal oscillator 108 outputs a reference output frequency which is sent to the frequency error measurer 114. The frequency error measurer 114 also receives a factory reference frequency and measures the error between the reference output frequency from the crystal oscillator 108 and the factory reference frequency. The temperature sensor 110 (e.g., a thermistor, silicon diode, etc.) senses the temperature of the crystal oscillator 108 when the crystal oscillator 108 generates the reference output frequency, and the sensed temperature is output to the ADC 112 which digitizes the sensed temperature. The measured frequency error from the frequency error measurer 114 and the digitized temperature from the ADC 112 are output to the software 104 component of the system 100.

The software 104 receives the frequency error measurement as well as the temperature measurement, and a fixed matrix calculation 116 is performed. The calculation 116 determines the polynomial coefficients that are used to build the frequency vs. temperature polynomial model 118.

Figure 2:
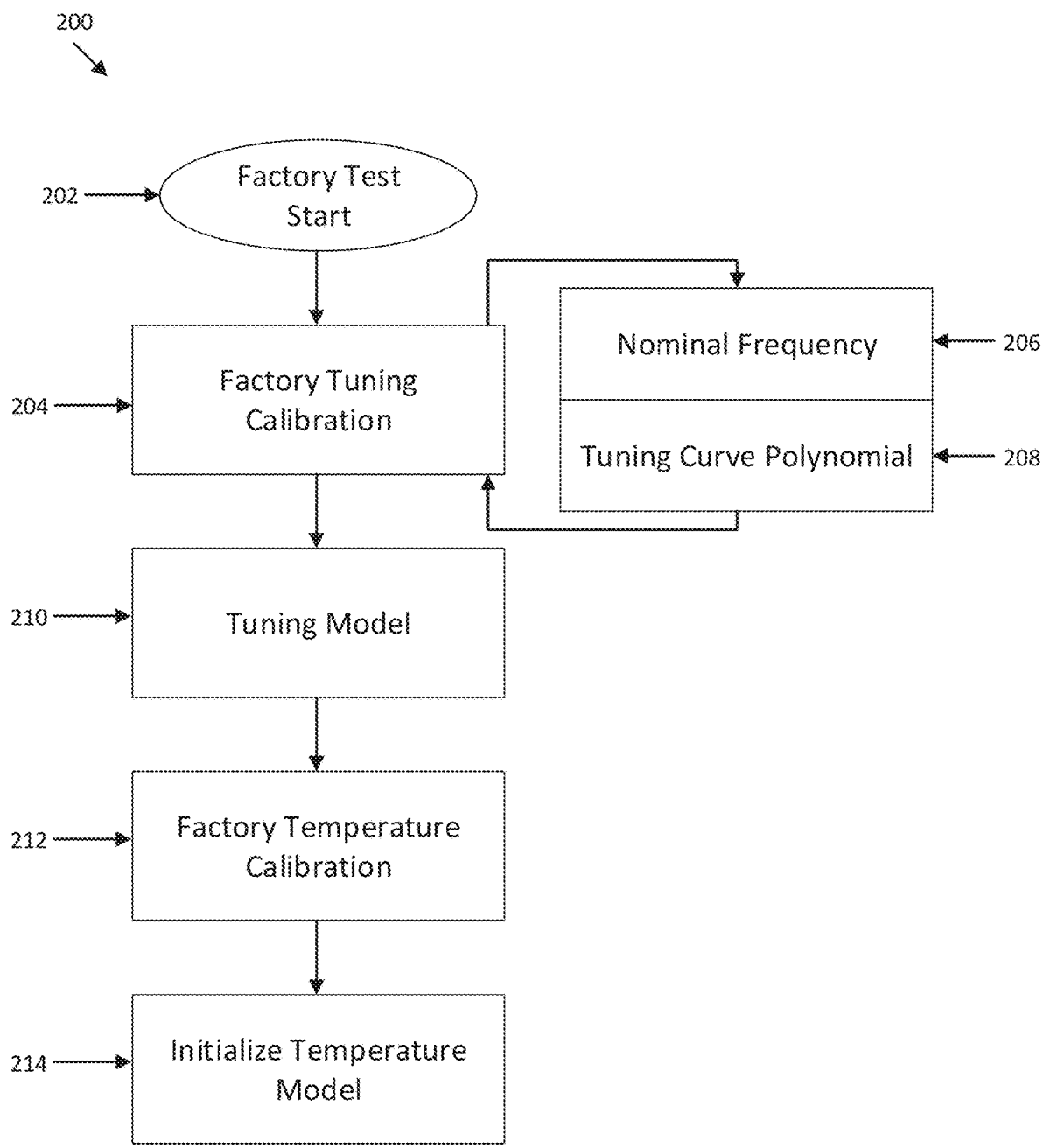
FIG. 2 is a flowchart for factory initial calibration, according to an embodiment

FIG. 2 is a flowchart 200 for factory initial calibration, according to an embodiment. At 202, the factory test is started. At 204, factory tuning calibration is performed for DCXO. The tuning calibration is used to determine C0 and the nominal frequency offset near T0. Then, if a DCXO is used, C0 may be removed from the temperature curve formulas by setting the tuning value to give zero offset. The calibration 204 may be performed through repeated measurement of the nominal frequency 206 and determination of a tuning curve polynomial 208 until the necessary or desired number of polynomials are determined. At 204, 206 and 208, the DCXO tuning curve is determined by stepping the tuning value to several points across the tuning range and measuring the frequency for each step. At 210, the tuning model is established. The tuning model 210 is measured if a DCXO is used to correct the frequency. Then, a polynomial tuning model 210 is determined from the several sets of tuning value and frequencies at 208. At 212, factory temperature calibration is performed, which is described in greater detail at FIG. 4. At 214, the temperature model resulting from the calibration at 212 is initialized. The temperature model may be used to predict frequency error and, if a DCXO is used, then the tuning model is used to calculate the correct tuning value to correct the frequency error.

Factory calibration, however, can be expensive if it consumes significant amounts of time. For example, a typical crystal model may be of a third order polynomial having five variables with four independent variables, as shown in Equation (1):

$$f = C0 + C1*(T-T_0) + C2*(T-T_0)^2 + C3*(T-T_0)^3 \quad (1)$$

f represents the crystal frequency with C0, C1, C2, and C3 being the independent variables and $T_0$ being the initial temperature variation (or inflection temperature/inflection point, as in some cases, $T_0$ has variations and may not be a zero temperature or an initial temperature of the calibration process) $T_0$ may have some variations due to the manufacturing process. When $T_0$ is tightly specified, then the number of variables in Equation (1) is reduced to four.

In factory calibrations of temperature, it is desirable to limit the number of measurements taken. Typically two measurements are utilized. Furthermore, the temperature measured should be only the temperature created from the product self-heating during the normal product test cycle (it may only self-heat less than a few degrees Celsius (° C.)). However, with only two frequency measurements, the four variables (e.g., C0, C1, C2, and C3) cannot be defined. This results in large errors occurring at temperature extremes of the product that are far from the test temperatures.

Figure 3:
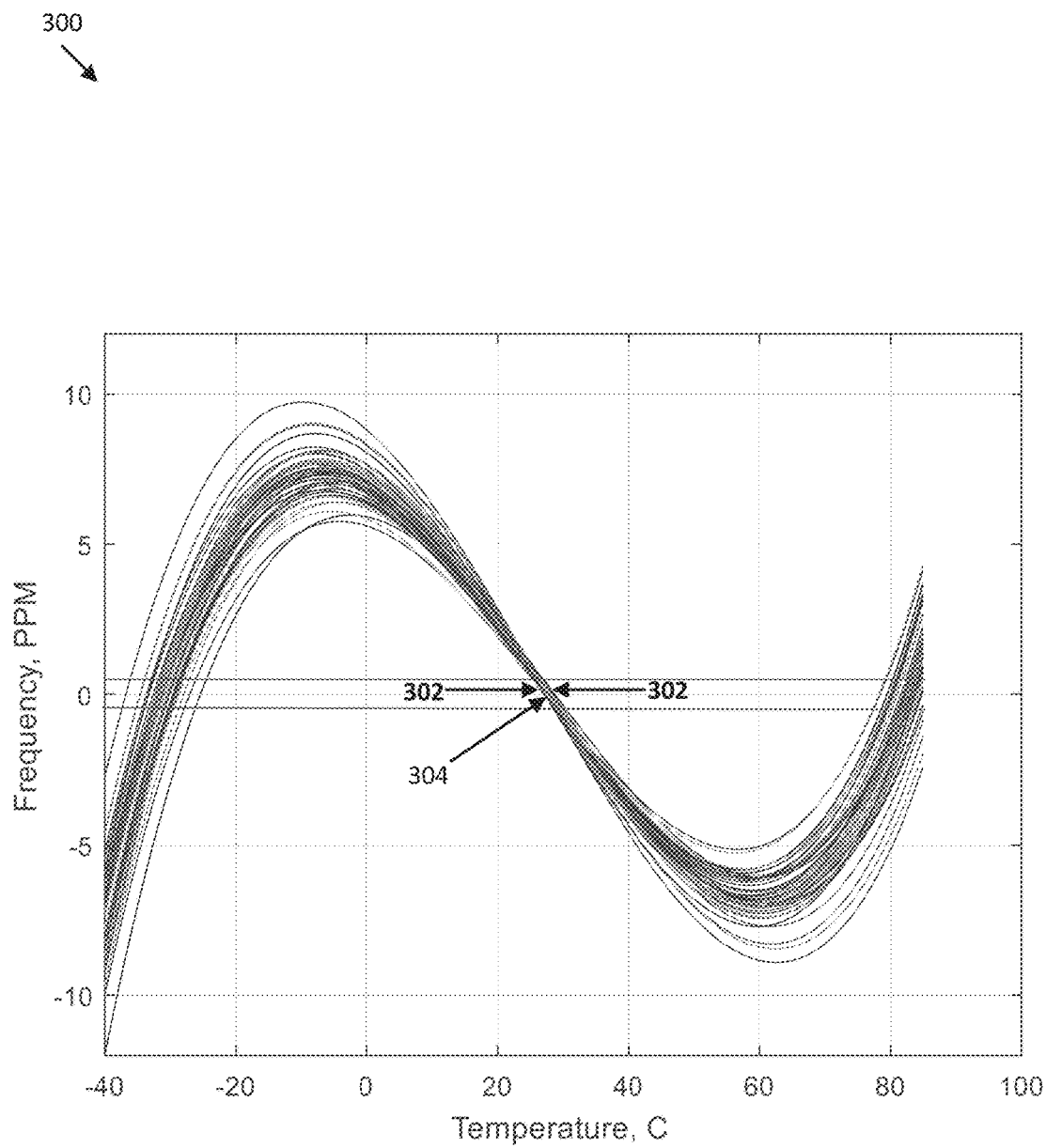
FIG. 3 is a graph showing initial build accuracy, according to an embodiment.

FIG. 3 is a graph 300 showing the typical variation of the reference temperature $T_0$ In FIG. 3, the C0 term in the polynomial, often referred to as nominal offset or initial build error is not included in the graph 300. In this case, the reference temperature $T_0$ can be viewed as the zero x-axis crossing of the polynomial curves 304. It can be observed that although there is variation in the crystal frequency curves of different crystals, there is minimal $T_0$ variation 302. This minimal $T_0$ variation 302 indicates that tightly define $T_0$ is possible and can be utilized in the crystal models directly instead of a variable in the model.

Figure 4:
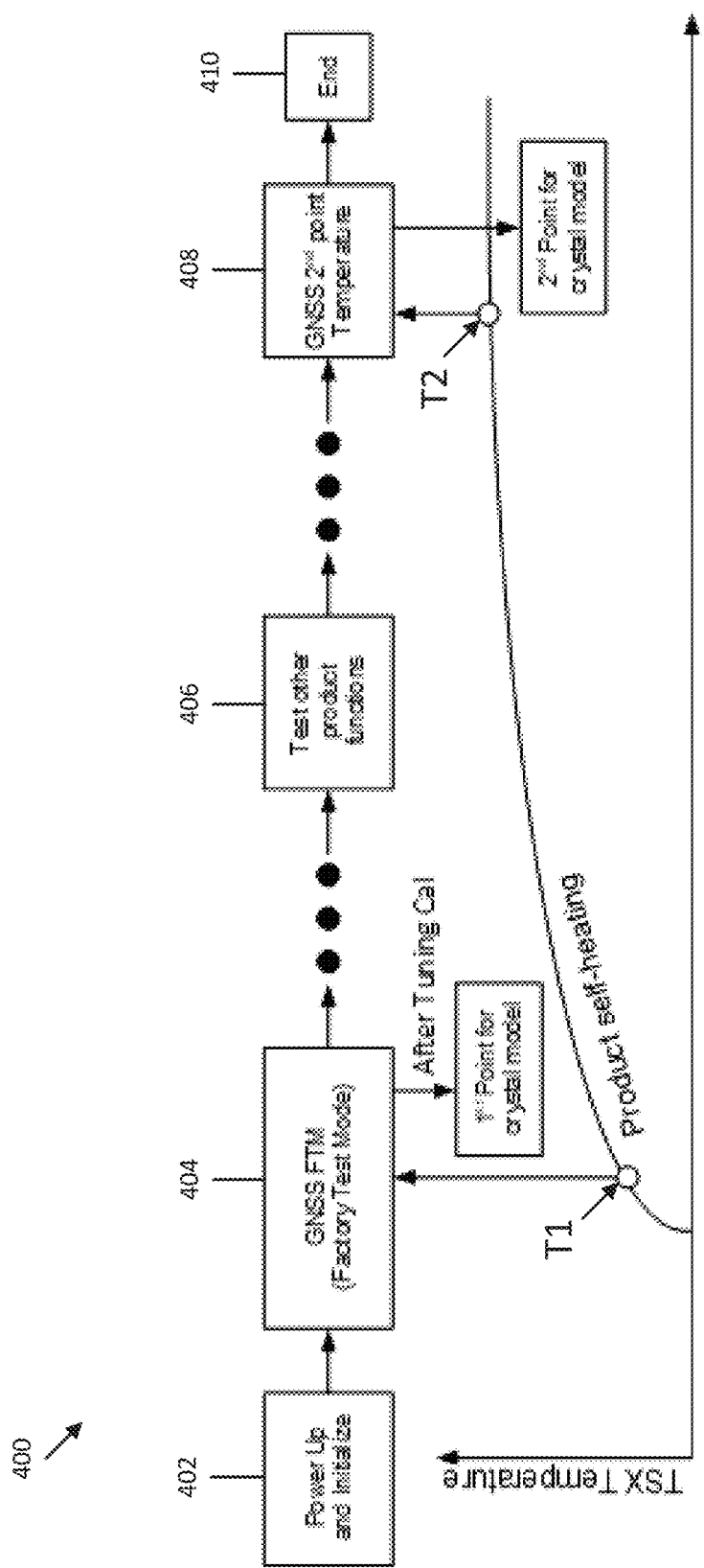
FIG. 4 is a diagram of a product testing process, according to an embodiment.

FIG. 4 is a diagram 400 of a product testing process, according to an embodiment. At 402, the process is initialized as described above with respect to FIG. 2. As the initialization begins, the temperature of the product including a crystal oscillator may increase due to self-heating (e.g., heating of the product itself due to the product testing process). At 404, a GNSS may be activated in factory test mode as 404 may be the point in time where the GNSS is the product function is being tested. The temperature (T1) of the product may be sampled and the GNSS may measure frequency error (f1) of the oscillator. Alternatively, the GNSS may be activated for measuring the frequency error outside of the factory test mode. The temperature and the measured frequency error are then used as the first calibration point (T1,f1) for generating the crystal model. At 406, other product functions are tested, resulting in a rise in temperature due to the self-heating of the product/oscillator.

At 408, the GNSS is activated (or has remained active from 404) and is used to measure the frequency error (f2) of the oscillator, and the temperature of the crystal is also measured at 408. The temperature and the frequency error measured at 408 are then used as the second calibration point (T2,f2) for generating the crystal model. At 410, the product test cycle ends.

As shown in FIG. 4, as the testing process proceeds, the temperature of the product and the oscillator increase due to self-heating as a result of the product functions being tested. The temperature variations may be relatively small (e.g., about 1° C. to about 3° C.). The temperature change in the test product is generally uncontrolled, which provides a highly economical solution as each crystal must be individually calibrated as they are each different.

When $T_0$ is tightly specified, Equation (1) may be written as Equation (2).

$$f = C0 + \sum_m C_m * (T - T_0)^m \quad (2)$$

m defines the order of the polynomial (e.g., m=1, 2, or 3), and $C_m$ is a variable at order m.

Equation (2) is a third order polynomial with 4 parameters (C0, C1, C2, and C3). The 4 parameters are to be estimated by calibration using only two measurements. The two calibration points result in large frequency errors over the full temperature range.

The present systems and methods generate a crystal model as a third order polynomial, but only using two parameters. The crystal model is written as Equation (3).

$$f = C0 + \sum_m (b_{1m} + b_{2m} * \theta) * (T - T_0)^m \quad (3)$$

Equation (3) is a third order polynomial where m=1, 2, or 3, and the two parameters, C0 and θ are estimated by calibration. b is a fixed matrix with 3 columns by 2 rows (e.g., a 2×3 matrix) for C1, C2, and C3. The size of the b matrix is dependent on the order of the polynomial and the number of measurements. Matrix b (e.g., the fixed matrix) can be pre-determined by measuring many pairs of frequency and temperature over the entire temperature range for a number of samples. This process has to be done prior to the factory calibration process. The b matrix may then be determined by minimizing the deviations from Equation (3) of these pre-factory measurements.

To determine C0 and θ, Equation (3) can be rewritten as Equation (4):

$$f - \sum_m b_{1m}(T - T_0)^m = C0 + \left(\sum_m b_{2m}(T - T_0)^m\right)\theta \quad (4)$$

Having two measurement points (T1,f1) and (T2,f2) as described above with respect to FIG. 4, matrix J and matrix z can be defined as Equations (5) and (6):

$$J = \begin{bmatrix} 1 & \sum_m b_{2m}(T_1 - T_0)^m \\ 1 & \sum_m b_{2m}(T_2 - T_0)^m \end{bmatrix} \quad (5)$$

$$z = \begin{bmatrix} f_1 - \sum_m b_{1m}(T_1 - T_0)^m \\ f_2 - \sum_m b_{1m}(T_2 - T_0)^m \end{bmatrix} \quad (6)$$

Thus, C0 and θ may be calculated as Equation (7):

$$\begin{bmatrix} C0 \\ \theta \end{bmatrix} = J^{-1} * z \quad (7)$$

Figure 6:
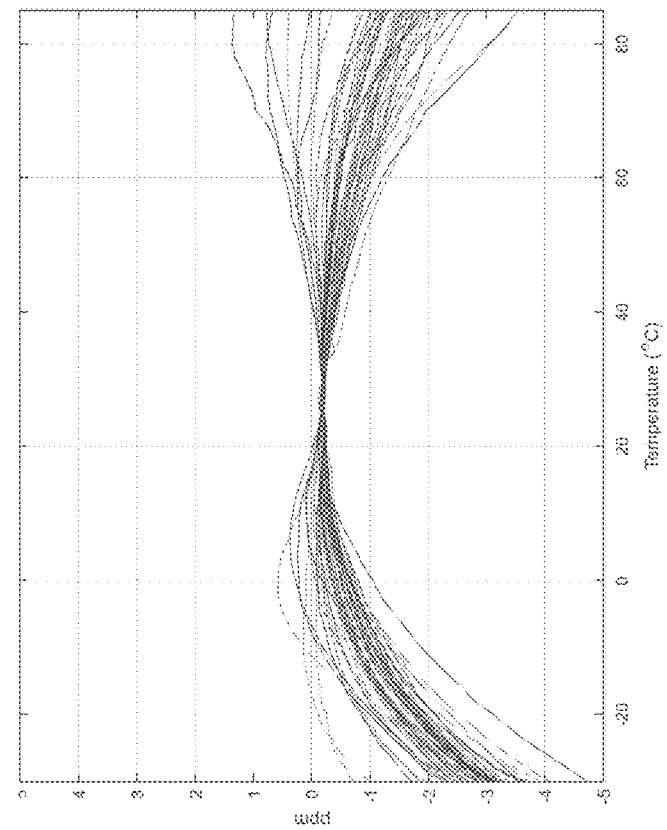
FIG. 6 is a graph showing performance of a test product, according to an embodiment.
Figure 5:
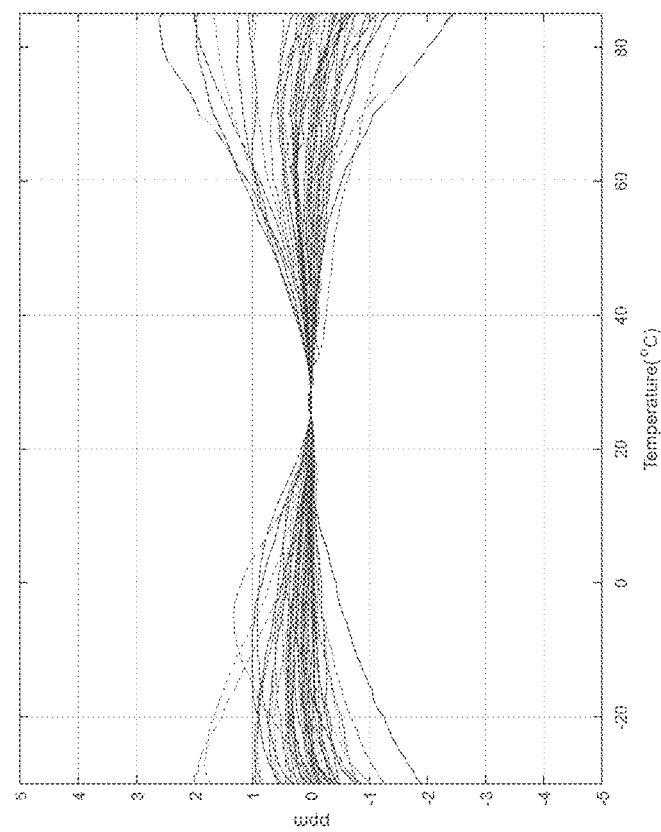
FIG. 5 is a graph showing performance of a test product, according to an embodiment.

FIG. 5 is a graph 500 showing performance of a test product with a crystal model generated using Equation (2), according to an embodiment. FIG. 6 is a graph 600 showing performance of a test product with a crystal model generated using Equation (3), according to an embodiment. The graphs 500 and 600 show two point factory calibration at temperature 25° C. and 29° C. The test product shown in graph 600 demonstrates improved performance, particularly at the extreme temperature levels.

The present systems and methods include a factory two-point temperature calibration block that provides initial determination of a frequency/temperature model and, if a DCXO is used, a Tuning Curve model for the purpose of translating a desired frequency correction into a tuning value to be applied to the DCXO. The present systems and methods measure a first temperature point.

The present systems and methods further measure a second temperature point and corresponding frequency error at a later time in the product testing process (e.g., 30 seconds later). During production, the present systems and methods measure the second temperature point and corresponding frequency error when other product tests are completed. This may typically take 15 to 45 s. The present systems and methods initialize the present crystal model as described above where the four temperature polynomial coefficients are calculated from the two measurements by way of the b matrix relating the hidden variable θ to the polynomial coefficients.

Figure 7:
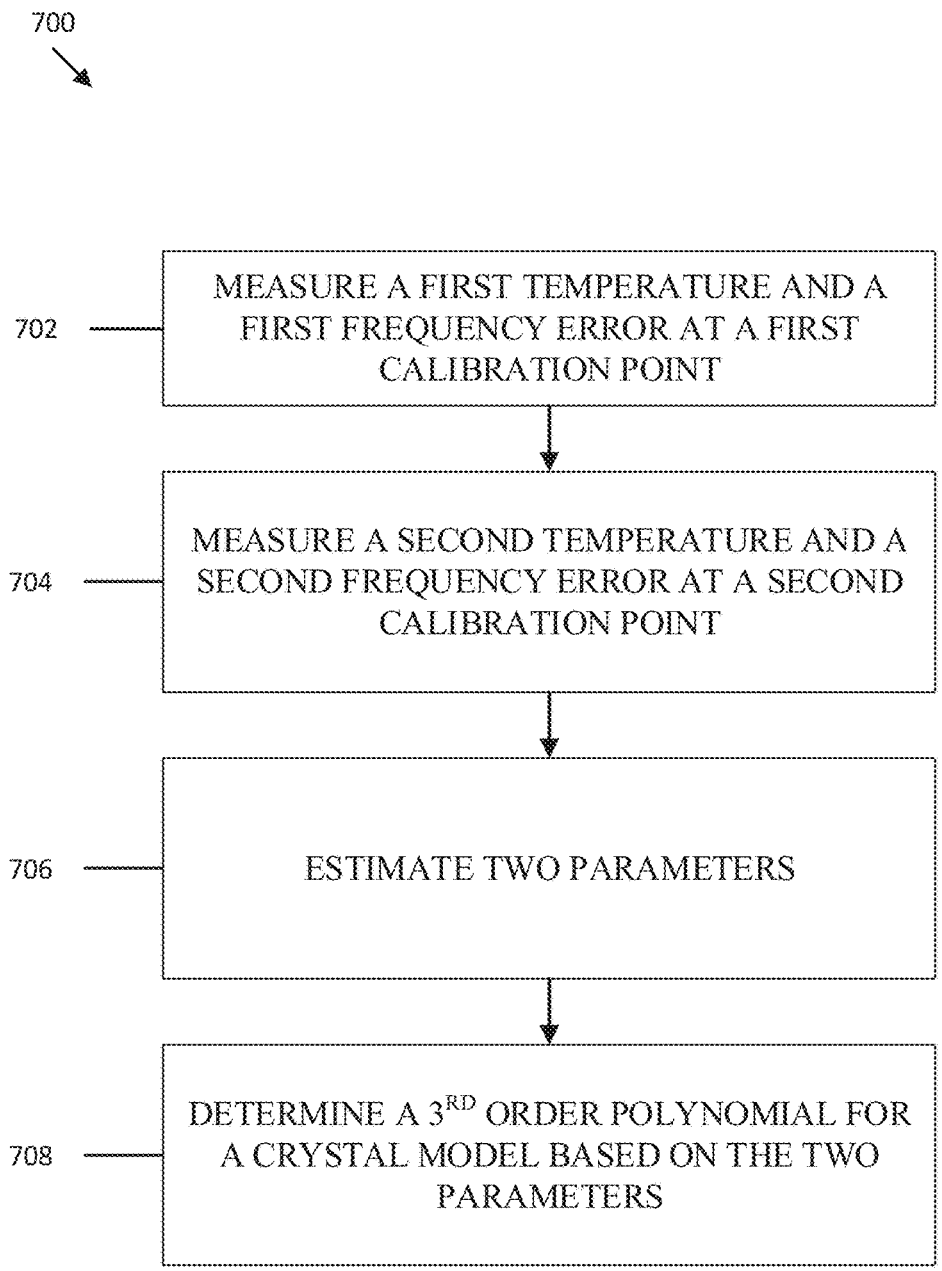
FIG. 7 is a flowchart for generating a crystal model, according to an embodiment.

FIG. 7 is a flowchart 700 for generating a crystal model, according to an embodiment. At 702, a first temperature and a first frequency error are measured at a first calibration point. At 704, a second temperature and a second frequency error are measured at a second calibration point. At 706, two parameters are estimated based on the first temperature, first frequency error, second temperature and second frequency error. At 708, a $3^{rd}$ order polynomial is determined for a crystal model based on the two parameters.

The present crystal model provides improved frequency accuracy "out-of-the-box" (i.e., as the crystal product is first used after leaving the factory). Hardware compensation of the crystal oscillator allows radios to be independently designed with no regard to central frequency correction commands since the reference frequency is already corrected. This reduces inter-dependencies of various radio blocks in complex chip sets, simplifies program management, and potentially reduces the number of spins required to create a new integrated circuit design.

Figure 8:
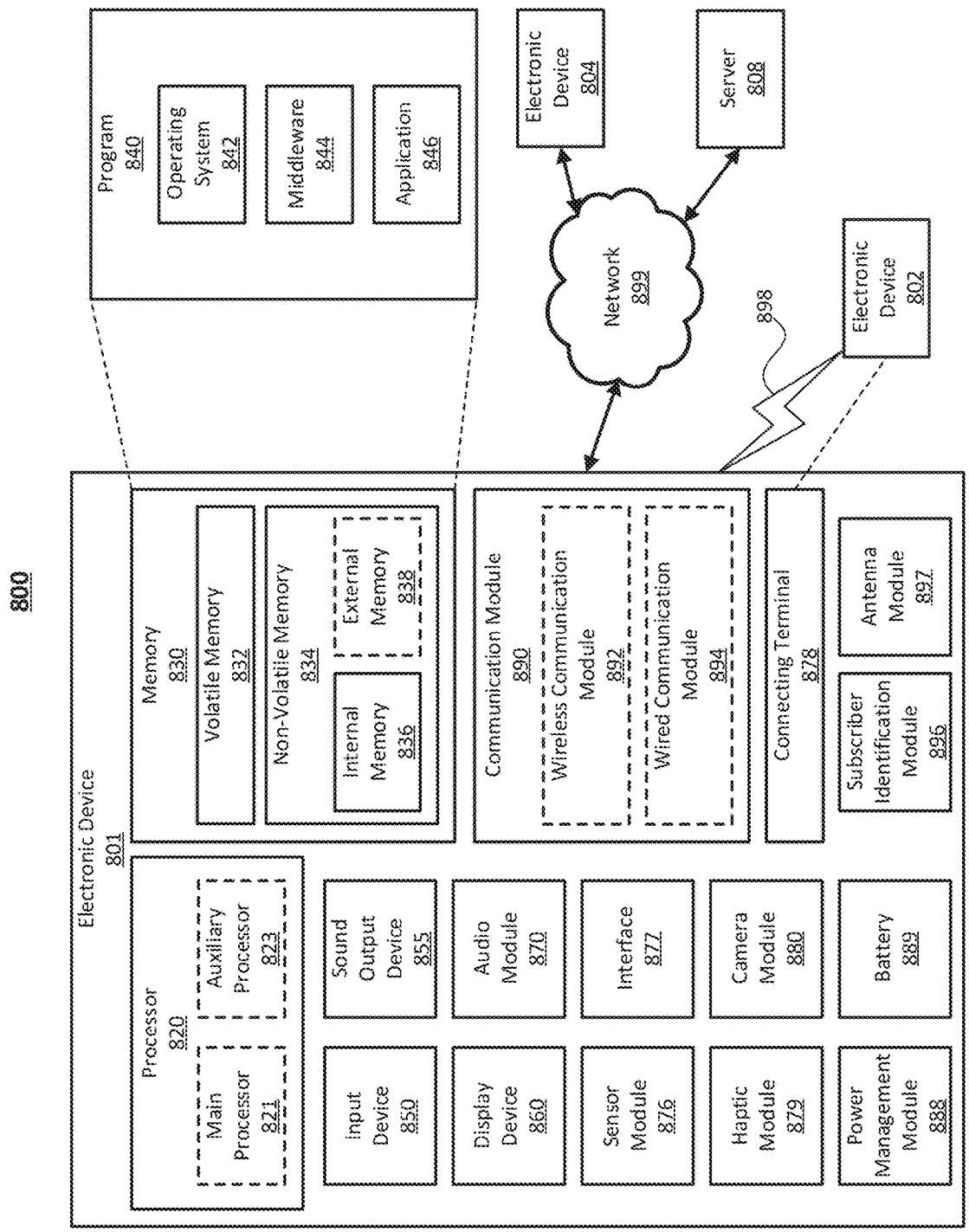
FIG. 8 is a block diagram of an electronic device in a network environment, according to one embodiment.

FIG. 8 is a block diagram of an electronic device 801 in a network environment 800, according to one embodiment. Referring to FIG. 8, the electronic device 801 in the network environment 800 may communicate with an electronic device 802 via a first network 898 (e.g., a short-range wireless communication network), or an electronic device 804 or a server 808 via a second network 899 (e.g., a long-range wireless communication network). The electronic device 801 may communicate with the electronic device 804 via the server 808. The electronic device 801 may include a processor 820, a memory 830, an input device 850, a sound output device 855, a display device 860, an audio module 870, a sensor module 876, an interface 877, a haptic module 879, a camera module 880, a power management module 888, a battery 889, a communication module 890, a subscriber identification module (SIM) 896, or an antenna module 897. In one embodiment, at least one (e.g., the display device 860 or the camera module 880) of the components may be omitted from the electronic device 801, or one or more other components may be added to the electronic device 801. In one embodiment, some of the components may be implemented as a single integrated circuit (IC). For example, the sensor module 876 (e.g., a fingerprint sensor, an iris sensor, or an illuminance sensor) may be embedded in the display device 860 (e.g., a display).

The processor 820 may execute, for example, software (e.g., a program 840) to control at least one other component (e.g., a hardware or a software component) of the electronic device 801 coupled with the processor 820, and may perform various data processing or computations. As at least part of the data processing or computations, the processor 820 may load a command or data received from another component (e.g., the sensor module 876 or the communication module 890) in volatile memory 832, process the command or the data stored in the volatile memory 832, and store resulting data in non-volatile memory 834. The processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or execute a particular function. The auxiliary processor 823 may be implemented as being separate from, or a part of, the main processor 821.

The auxiliary processor 823 may control at least some of the functions or states related to at least one component (e.g., the display device 860, the sensor module 876, or the communication module 890) among the components of the electronic device 801, instead of the main processor 821 while the main processor 821 is in an inactive (e.g., sleep)

state, or together with the main processor 821 while the main processor 821 is in an active state (e.g., executing an application). According to one embodiment, the auxiliary processor 823 (e.g., an image signal processor or a communication processor) may be implemented as part of another component (e.g., the camera module 880 or the communication module 890) functionally related to the auxiliary processor 823.

The memory 830 may store various data used by at least one component (e.g., the processor 820 or the sensor module 876) of the electronic device 801. The various data may include, for example, software (e.g., the program 840) and input data or output data for a command related thererto. The memory 830 may include the volatile memory 832 or the non-volatile memory 834.

The program 840 may be stored in the memory 830 as software, and may include, for example, an operating system (OS) 842, middleware 844, or an application 846.

The input device 850 may receive a command or data to be used by other component (e.g., the processor 820) of the electronic device 801, from the outside (e.g., a user) of the electronic device 801. The input device 850 may include, for example, a microphone, a mouse, or a keyboard.

The sound output device 855 may output sound signals to the outside of the electronic device 801. The sound output device 855 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. According to one embodiment, the display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. According to one embodiment, the audio module 870 may obtain the sound via the input device 850, or output the sound via the sound output device 855 or a headphone of an external electronic device 802 directly (e.g., wiredly) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. The sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device 802 directly (e.g., wiredly) or wirelessly. According to one embodiment, the interface 877 may include, for example, a high definition multimedia interface (HDMI), a universal serial bus (USB) interface, a secure digital (SD) card interface, or an audio interface.

A connecting terminal 878 may include a connector via which the electronic device 801 may be physically connected with the external electronic device 802. According to one embodiment, the connecting terminal 878 may include, for example, an HDMI connector, a USB connector, an SD card connector, or an audio connector (e.g., a headphone connector).

The haptic module 879 may convert an electrical signal into a mechanical stimulus (e.g., a vibration or a movement) or an electrical stimulus which may be recognized by a user via tactile sensation or kinesthetic sensation. According to one embodiment, the haptic module 879 may include, for example, a motor, a piezoelectric element, or an electrical stimulator.

The camera module 880 may capture a still image or moving images. According to one embodiment, the camera module 880 may include one or more lenses, image sensors, image signal processors, or flashes.

The power management module 888 may manage power supplied to the electronic device 801. The power management module 888 may be implemented as at least part of, for example, a power management integrated circuit (PMIC).

The battery 889 may supply power to at least one component of the electronic device 801. According to one embodiment, the battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the AP) and supports a direct (e.g., wired) communication or a wireless communication. According to one embodiment, the communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as Bluetooth, wireless-fidelity (Wi-Fi) direct, or a standard of the Infrared Data Association (IrDA)) or the second network 899 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may transmit or receive a signal or power to or from the outside (e.g., the external electronic device) of the electronic device 801. According to one embodiment, the antenna module 897 may include one or more antennas, and, therefrom, at least one antenna appropriate for a communication scheme used in the communication network, such as the first network 898 or the second network 899, may be selected, for example, by the communication module 890 (e.g., the wireless communication module 892). The signal or the power may then be transmitted or received between the communication module 890 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 801 and the external electronic device 804 via the server 808 coupled with the second network 899. Each of the electronic devices 802 and 804 may be a device of a same type as, or a different type, from the electronic device 801. All or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

One embodiment may be implemented as software (e.g., the program 840) including one or more instructions that are stored in a storage medium (e.g., internal memory 836 or external memory 838) that is readable by a machine (e.g., the electronic device 801). For example, a processor of the electronic device 801 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method of generating a crystal model for a test product including a crystal oscillator, comprising:
    measuring a first temperature of the test product and measuring a first frequency error of the crystal oscillator at a first calibration point during a product testing process;
    testing at least one function of the test product during the product testing process after measuring the first temperature;
    measuring a second temperature of the test product and measuring a second frequency error of the crystal oscillator at a second calibration point after testing the at least one function of the test product, wherein the second temperature is reached as a result of heating of the test product caused by testing the at least one function of the test product;
    estimating two parameters from the first temperature, first frequency error, second temperature, and second frequency error; and
    determining a 3rd order polynomial for the crystal model based on the two parameters.

2. The method of claim 1, wherein the first frequency error and the second frequency error are measured by a global navigation satellite system (GNSS) of the test product.

3. The method of claim 2, wherein the first frequency error is measured by the GNSS when the GNSS is being tested during the product testing process.

4. The method of claim 1, wherein a variation between the first temperature and the second temperature is about 1° C. to about 3° C.

5. The method of claim 1, wherein the first temperature and the second temperature are measured with a temperature sensor co-located with the crystal oscillator.

6. The method of claim 1, wherein a change from the first temperature to the second temperature is uncontrolled during the product testing process.

7. The method of claim 1, wherein the two parameters are estimated using a fixed matrix.

8. The method of claim 1, wherein the 3rd order polynomial is in the form of $$f=C0+\Sigma_m(b_{1m}+b_{2m}*\theta)*(T-T_0)^m,$$

where C0 and $\theta$ are the estimated two parameters and b is a fixed matrix.

9. A system for generating a crystal model for a test product including a crystal oscillator, comprising:
- a temperature sensor configured to measure a first temperature of the test product at a first calibration point during a product testing process and measure a second temperature of the test product at a second calibration point during the product testing process;
- a frequency error measurer configured to measure a first frequency error of the crystal oscillator at the first calibration point during the product testing process and measure a second frequency error of the crystal oscillator at the second calibration point during the product testing process; and
- a processor configured to:
  - test at least one function of the test product during the product testing process after the first temperature is measured;
  - estimate two parameters from the first temperature, first frequency error, second temperature, and second frequency error, and
    - determine a $3^{rd}$ order polynomial for the crystal model based on the two parameters,
  - wherein second temperature is reached as a result of heating of the test product caused by testing the at least one function of the test product after the first temperature is measured.

10. The system of claim 9, wherein the frequency error measurer includes a global navigation satellite system (GNSS) of the test product.

11. The system of claim 10, wherein the first frequency error is measured by the GNSS when the GNSS is being tested during the product testing process.

12. The system of claim 9, wherein a variation between the first temperature and the second temperature is about 1° C. to about 3° C.

13. The system of claim 9, wherein the temperature sensor is co-located with the crystal oscillator.

14. The system of claim 9, wherein a change from the first temperature to the second temperature is uncontrolled during the product testing process.

15. The system of claim 9, wherein the two parameters are estimated using a fixed matrix.

16. The system of claim 9, wherein the $3^{rd}$ order polynomial is in the form of $$f=C0+\Sigma_m(b_{1m}+b_{2m}*\theta)*(T-T_0)^m,$$

where C0 and $\theta$ are the estimated two parameters and b is a fixed matrix.

17. A method for testing an electronic product including a crystal oscillator, comprising:
- measuring a first temperature of the electronic product and measuring a first frequency error of the crystal oscillator at a first calibration point;
- testing at least one function of the test product during the product testing process after measuring the first temperature;
- measuring a second temperature of the electronic product and measuring a second frequency error of the crystal oscillator at a second calibration point after testing the at least one function of the test product, wherein the second temperature is reached as a result of heating of the test product caused by testing the at least one function of the test product; and
- generating a crystal model for the crystal oscillator by:
  - estimating two parameters from the first temperature, first frequency error, second temperature, and second frequency error; and
  - determining a $3^{rd}$ order polynomial for the crystal model based on the two parameters.

18. The method of claim 17, wherein a change from the first temperature to the second temperature is uncontrolled during the product testing process.

19. The method of claim 17, wherein a variation between the first temperature and the second temperature is about 1° C. to about 3° C.

20. The method of claim 17, wherein the 3rd order polynomial is in the form of $$f=C0+\Sigma_m(b_{1m}+b_{2m}*\theta)*(T-T_0)^m,$$

where C0 and $\theta$ are the estimated two parameters and b is a fixed matrix.

* * * * *